United States Patent [19]
Huang

[11] Patent Number: 6,060,741
[45] Date of Patent: May 9, 2000

[54] STACKED GATE STRUCTURE FOR FLASH MEMORY APPLICATION

[75] Inventor: Richard J. Huang, Cupertino, Calif.

[73] Assignee: Advanced Micro Devices, Inc., Sunnyvale, Calif.

[21] Appl. No.: 09/154,072

[22] Filed: Sep. 16, 1998

[51] Int. Cl.[7] ............. H01L 21/8247; H01L 29/788; H01L 29/76; H01L 29/94
[52] U.S. Cl. ............. 257/315; 257/316; 257/412; 438/593
[58] Field of Search ............. 438/257–267, 438/593–594; 257/315–323, 412, 413

[56] References Cited

U.S. PATENT DOCUMENTS

| 5,536,667 | 7/1996 | Cho . | |
|---|---|---|---|
| 5,668,394 | 9/1997 | Lur et al. | 257/413 |
| 5,796,166 | 8/1998 | Agnello et al. | 257/751 |
| 5,923,999 | 7/1999 | Balasubramanyam et al. | 438/592 |
| 5,925,918 | 7/1999 | Wu et al. | 257/413 |
| 5,962,904 | 10/1999 | Hu | 257/412 |

*Primary Examiner*—Richard Booth

[57] ABSTRACT

In order to form a low resistance gate for use in a flash EPROM or EEPROM, a boron doped amorphous silicon layer is formed on an oxide layer and a layer of tungsten nitride formed thereon. A layer of tungsten silicide is then formed on the tungsten nitride layer acts as a barrier preventing "out diffusion" of a contaminating dopant, e.g., boron, and exhibits good adhesion to the amorphous silicon layer. The tungsten silicide layer, in turn, exhibits good adhesion to the tungsten nitride layer thereby preventing lifting of the silicide layer and dopant penetration.

12 Claims, 2 Drawing Sheets

STACKED GATE STRUCTURE FOR FLASH MEMORY APPLICATION

FIELD OF THE INVENTION

The present invention generally relates to a nonvolatile memory semiconductor device having a stacked gate electrode such as that used in flash memory applications. More specifically, the present invention relates to a nonvolatile semiconductor device having a low resistance stacked gate electrode with improved resistance to layer lifting and dopant diffusion.

BACKGROUND ART

As integrated circuit devices have become smaller, it is increasingly important to ensure that functional and reliable connections between integrated circuit devices and conductor elements within the integrated circuits can be readily and efficiently achieved and manufactured. Within integrated circuits of Metal Oxide Semiconductor Field Effect Transistors (MOSFETs), connections are often made through the use of polycide gate electrodes. Commonly, the polycide gate electrode is a tungsten silicide polycide gate electrode formed of a tungsten silicide upper layer and a polysilicon lower layer which in turn resides upon a MOSFET gate oxide layer.

Although tungsten silicide polycide gate electrodes within MOSFETs provide good surfaces onto which contact with conductor elements can be established, these types of arrangements tend to suffer from various drawbacks. For example, tungsten silicide polycide gate electrodes suffer from problems such as excess fluorine migration. This fluorine originates from tungsten hexafluoride, which is one of the materials used in chemical vapor deposition (CVD) of the tungsten silicide layer, and tends to occur between the tungsten silicide layer and the polysilicon layer/oxide layer interface therebelow, under high temperature annealing. This results in the thickness of the gate oxide layer having to be increased.

A further problem which is encountered with this particular type of arrangement resides in that dopants from within the polysilicon layer tend to redistribute during the thermal processing of the tungsten silicide polycide gate electrode. A yet further problem resides in that the tungsten silicide layers exhibit a high resistivity when formed upon large grain polysilicon layers.

In connection with the above mentioned problems, a method of forming a gate electrode for multiple polysilicon layer has been disclosed in U.S. Pat. No. 5,350,698 issued to Huang et al. This reference discloses the formation of multiple amorphous silicon layers which are subsequently annealed to form polysilicon layers, along with intervening silicon oxide layers and an optional terminal tungsten silicide layer. This arrangement is directed to limiting the channeling of ion implants observed through single polysilicon layers of equivalent thickness. Multiple amorphous silicon layers are discloses as being preferred since, upon annealing, they form a larger grain size than encountered with equivalent types of multiple polysilicon layer structures.

Another technique proposed in connection with these drawbacks resides in a method wherein multiple polysilicon layers or multiple amorphous silicon layers are interdispersed with silicon oxide layers. It has been further proposed to use stacked amorphous silicon (SAS) multilayer structures without interdispersed silicon oxide layers. This latter type of stacked amorphous silicon (SAS) multilayer structure, when annealed to form the polysilicon layers, is said to improve the performance of the resulting integrated circuit device. More specifically, the use of stacked amorphous silicon (SAS) multiple layer structures has been reported to, following annealing, suppress boron penetration from polysilicon gate electrodes into underlying thin gate oxide layers within P-metal oxide semiconductor field effect transistors (pMOSFETs).

Further efforts in connection with developing MOSFETs with tungsten silicide polycide gate electrodes exhibiting good diffusion barrier properties, good dopant retention properties, and good contact resistance properties, is disclosed in U.S. Pat. No. 5,710,454 issued to Wu on Jan. 20, 1998. Wu discloses a method of forming tungsten silicide polycide gate electrodes within MOSFET which is directed to limiting redistribution of dopants from within the polysilicon layer of the tungsten silicide polycide gate electrode.

In accordance with Wu's technique, a semiconductor substrate gate oxide layer is firstly formed. A first polysilicon layer is then formed on the gate oxide layer by initially forming an amorphous silicon layer and then annealing to convert it to polysilicon. A second polysilicon layer is formed through a similar process. That is to say, amorphous silicon is formed and then converted to polysilicon through annealing. The tungsten silicide layer is then formed on the second polysilicon layer through the use of chemical vapor deposition (CVD). With this method, the first and second polysilicon layers have a crystallite size no greater than 0.3 microns, and have a dopant concentration of greater than 1E16 atoms cm$^3$.

While this method purports to inhibit the diffusion of fluorine from the tungsten silicide layer through the thermal annealing of a stacked amorphous silicon (SAS) multilayer structure, it has nevertheless tended to suffer from the drawback that the tungsten silicide layer tends to separate, that is to say undergo lifting, from the underlying polysilicon layers, with the result that productivity is accordingly reduced.

Accordingly, there exists a need for a stacked gate structure which exhibits both resistance to layer separation and dopant diffusion.

SUMMARY OF THE INVENTION

An advantage of the present invention is a semiconductor device having a stack gate structure for flash memory application, which stacked gate exhibits reduced resistivity, good resistance to boron penetration, and which attenuates the lifting of the tungsten silicide layer.

In brief, the above advantages are achieved through an arrangement wherein, in order to form a low resistance gate for use in a flash EPROM (Electronically Programmable Read Only Memory), or an EEPROM (Electronically Erasable Programmable Read Only Memory Device) a doped amorphous silicon layer, e.g., boran doped, is formed on a dielectric layer, e.g., an oxide layer. The doped amorphous silicon layer is then covered with a layer of tungsten nitride which is in turn covered with a layer of tungsten silicide. The tungsten nitride layer acts as a barrier which prevents "out diffusion" of the contaminating dopant, e.g., boron, and exhibits good adhesion to the amorphous silicon layer. The tungsten silicide layer, in turn, exhibits good adhesion to the tungsten nitride layer with the result that lifting of the silicide layer and the contaminating penetration of boron is prevented.

More specifically, an aspect of the invention resides in a method of forming a semi-conductive device having a gate electrode, the method comprising: forming an amorphous silicon layer on a gate oxide layer; forming a tungsten nitride layer on the amorphous silicon layer; and forming a tungsten silicide layer on the tungsten nitride layer. This method further features the steps of: forming an interpoly dielectric layer over the tungsten silicide layer; and forming a polysilicon layer over the interpoly dielectric layer in a manner to act as a control gate. These layers are then encased in a dielectric layer.

In accordance with the present invention the tungsten nitride layer has the formula $NW_y$, wherein y has a value which falls in the range of about 2– about 3, while the tungsten silicide layer has the formula $SiW_x$, wherein x has a value which falls in the range of about 1.7– about 2.7.

Another aspect of the invention resides in a semiconductor device having a gate electrode comprising: an amorphous silicon layer formed on a gate oxide layer; a tungsten nitride layer formed on the amorphous silicon layer; and a tungsten silicide layer formed on the tungsten nitride layer. These layers are further supplemented by an interpoly dielectric layer formed over the tungsten silicide layer; and a polysilicon layer formed over the interpoly dielectric layer. All of these layer with the exception of the gate oxide layer are encased in a dielectric layer.

In accordance with this aspect of the invention, the tungsten nitride layer has the formula $WN_y$, wherein y has a value which falls in the range of about 2– about 3, while the tungsten silicide layer has the formula $SiW_x$, wherein x has a value which falls in the range of about 1.7– about 2.7.

BRIEF DESCRIPTION OF DRAWINGS

The various features and advantages of the present invention will become more clearly understood as a detailed description of the preferred embodiments is given with reference to the appended drawings wherein.

DETAILED DESCRIPTION OF THE PREFERRED EMBODIMENTS

Figure 1:
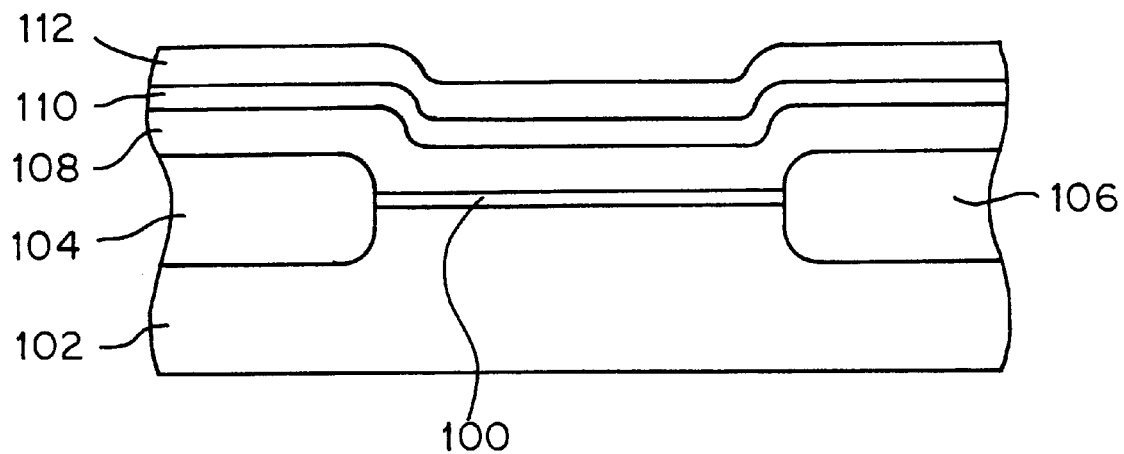
FIG. 1 is a schematic sectional view showing the results of progressive formations of layers during the fabrication of a stacked gate structure according to an embodiment of the present invention.

FIG. 1 is a cross-sectional view which depicts an early stage of the fabrication of a tungsten silicide polycide gate electrode according to an embodiment of the present invention. In this figure, a blanket oxide layer 100 is formed on an active semiconductor region 102 of a semiconductor substrate, using a conventional technique, such as oxidation of a superficial layer of the semiconductor substrate 102. Isolation regions 104 and 106 of $SiO_2$ are formed in the illustrated manner and are covered with a layer of amorphous silicon 108. Following this, a layer of tungsten nitride 110 and a subsequent layer of tungsten silicide 112 are subsequently formed in the illustrated manner.

Figure 2:
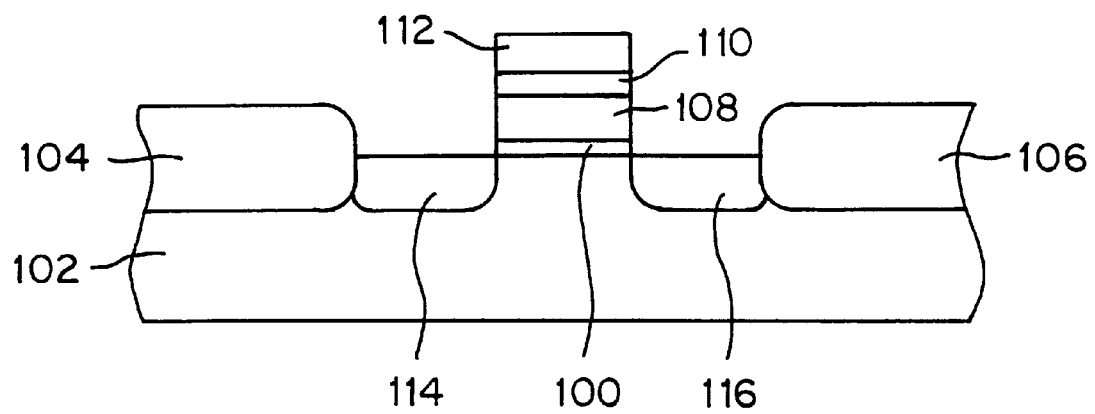
FIG. 2 is a schematic sectional view showing the gate electrode at an intermediate stage of its fabrication.
Figure 3:
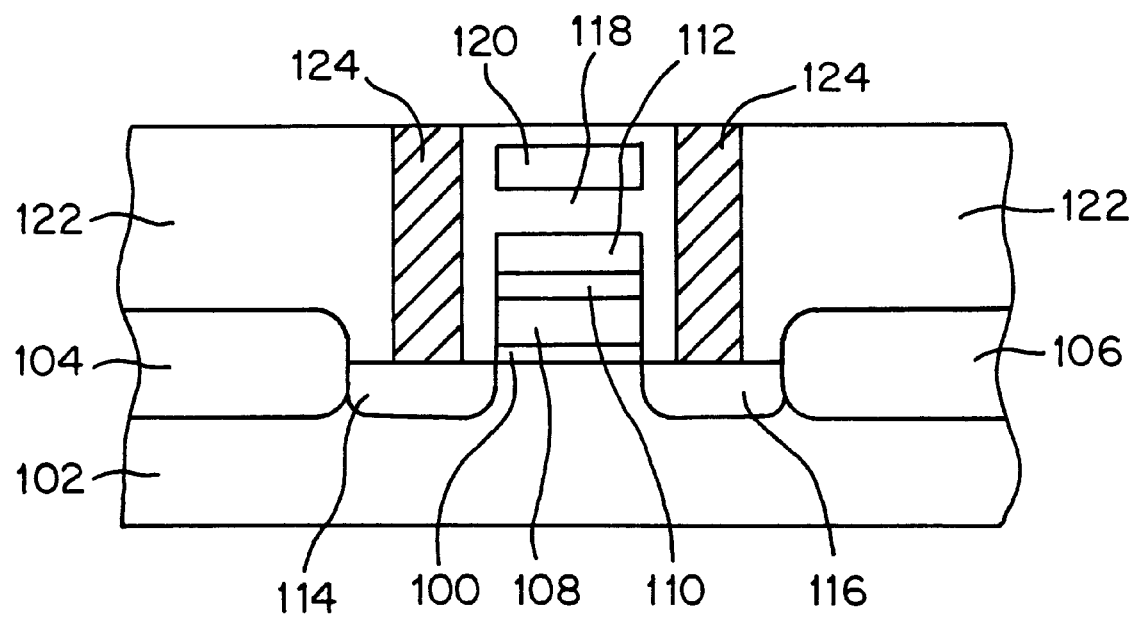
FIG. 3 is a schematic sectional view showing the completed gate electrode.

Following this, masking and etching are used to remove the portions of the layers and in a manner which leaves a stack of the nature depicted in FIG. 2. The source and drain regions 114, 116 are formed by masking and implanting a suitable dopant species into the active region of the semiconductor substrate at about 1E13 to about 5E16 ions per square centimeter dose at an implantation energy level of about 10–180 keV. In the illustrated embodiment, the dopant is phosphorous.

To complete the structure, an interpoly dielectric (ONO—Oxide/Nitride/Oxide) layer 118 and a layer of polysilicon 120 are formed on the tungsten silicide layer. The polysilicon layer 120 is used to form the control gate while the tungsten nitride/silicide/amorphous silicon layer acts as the floating gate. This gate structure is then encased in a dielectric layer 122. Openings are formed through the dielectric layer using a suitable etching technique and are filled with an electrically conductive material 124 such as aluminum, metal alloy or a heavily doped polysilicon in a conventional manner, e.g., thermal evaporation, electron beam assisted evaporation, CVD, and PVD sputtering.

In accordance with an embodiment of the present invention, the amorphous silicon layer 108 is deposited using silane as a source of material using a Low Pressure Chemical Vapor Deposition (LPCVD) technique at a temperature which is below 550° C. and at a deposition pressure of about 0.05. –3 Torr. This layer has grain size of about 0.1 microns, which is smaller than that of polysilicon, and a thickness of about 3000 Å. This layer is doped with boron. The concentration of dopant is device related.

In this particular instance, the active region of the semiconductor substrate has been doped with boron so as to form a p region below the oxide layer 100. However, it is to be noted that the present invention is not limited to this particular dopant and that this region can be doped in a manner which is well known in the art to form either p or n regions.

It is however, a feature of the invention that the use of the tungsten nitride as a barrier layer is effective in attenuating the "out diffusion" of boron from the underlying layers and is such as to additionally possess qualities which permit good adhesion to both the amorphous silicon layer and the tungsten silicide layer, and thus acts as a linking layer which improves the adhesion between the tungsten silicide layer and those which are located thereunder. Accordingly, the combination of the tungsten nitride and silicide layers overcomes problems wherein "out diffusion" of dopant such as boron from underlying layers is prevented and thus attenuates undesirable contamination, while additionally improving the adhesion between the tungsten based layers and the underlying layer formed of amorphous silicon. The lifting problem which is apt to occur if a layer of tungsten silicide is applied directly to the layer of amorphous silicon or polysilicon, is also overcome.

The formation of these tungsten nitride and silicide layers can conveniently be formed in situ in the same reaction chamber using conventional PECVD and/or a LPCVD techniques. In accordance with the present invention the tungsten silicide $WSi_x$ and the tungsten nitride $WN_y$ are such that x= about 1.7– about 2.7, while y= about 2– about 3. The boron concentration in the amorphous silicon layer is 1E15–1E17. The tungsten nitride layer in this embodiment is formed using a mixture of ammonia and tungsten hexafluoride ($NH_3/WF_6$) at temperature of 300–600° C. and a deposition pressure of 0.01–1.0 Torr while maintaining the $NH_3/WF_6$ partial pressure ration in a range of 0.25–2.0. The tungsten silicide layer, on the other hand, is formed using a mixture of $WF_6$ and $SiH_4$ gases wherein the flow rate of $WF_6$ is generally less than 25 sccm while the flow rate of higher order silanes such as disilane and trisilane, is generally less than 400 sccm. The temperature in this instance is maintained at about 370° C. Typically, the tungsten silicide layer has a thickness of about 500 Å to about 2000 Å, while the tungsten nitride layer has a thickness of about 50 Å to about 200 Å.

It is submitted that equipped with the preceding disclosure, one of skill in the art to which the present invention pertains would be able to make and practice the invention without recourse to undue experimentation, in that all of the steps which are used, are know and/or commonly used in the fabrication of semiconductor devices. Further, although the invention has been disclosed with reference to only one example of the invention, the various modifications and changes which can be made without departing from the invention, which is limited only by the appended claims, will be readily apparent to those skill in this art.

What is claimed is:

1. A method of forming a semiconductor having a floating gate electrode, the method comprising:

forming an amorphous silicon layer on a gate oxide layer;

forming a tungsten nitride layer on the amorphous silicon layer; and forming a tungsten silicide layer on the tungsten nitride layer to form said floating gate electrode.

2. The method as set forth in claim 1, further comprising:

forming an interpoly dielectric layer on the tungsten silicide layer, and forming a polysilicon layer on the interpoly dielectric layer, the polysilicon layer constituting a control gate.

3. The method as set forth in claim 2, further comprising depositing a dielectric layer.

4. The method as set forth in claim 1, comprising forming the tungsten nitride layer having the formula $NW_y$, wherein y has a value which falls in the range of about 2– about 3.

5. The method as set forth in claim 1, comprising forming the tungsten silicide layer having the formula $SiW_x$, wherein x has a value which falls in the range of about 1.7– about 2.7.

6. A semiconductor device having a floating gate electrode comprising:

an amorphous silicon layer formed on a gate oxide layer;

a tungsten nitride layer formed on the amorphous silicon layer; and a tungsten silicide layer formed on the tungsten nitride layer to form said floating gate electrode.

7. The gate electrode as set forth in claim 6, further comprising:

an interpoly dielectric layer formed on the tungsten silicide layer; and a polysilicon layer formed on the interpoly dielectric layer.

8. The gate electrode as set forth in claim 7, further comprising a dielectric layer which encases the polysilicon layer, interpoly dielectric layer, tungsten silicide layer, tungsten nitride layer and amorphous silicon layer.

9. The gate electrode as set forth in claim 6, wherein the tungsten nitride layer has the formula $WN_y$, wherein y has a value which falls in the range of about 2– about 3.

10. The gate electrode as set forth in claim 6, wherein the tungsten silicide layer has the formula $WSi_x$, wherein x has a value which falls in the range of about 1.7– about 2.7.

11. The semiconductor device as set forth in claim 6, wherein the tungsten nitride layer has a thickness of about 50 Å to about 200 Å.

12. The semiconductor device as set forth in claim 7, wherein the tungsten nitride layer has a thickness of about 50 Å to about 200 Å.

* * * * *